Feb. 17, 1970 A. G. F. DINGWALL ET AL 3,496,027

THERMOELECTRIC GENERATOR COMPRISING THERMOELEMENTS OF INDIUM-GALLIUM ARSENIDES OR SILICON-GERMANIUM ALLOYS AND A HOT STRAP OF SILICON CONTAINING SILICIDES

Filed May 3, 1965

INVENTOR.
ANDREW G.F. DINGWALL
& ROBERT K. PEARCE

BY Glenn H Brunstle
Attorney

United States Patent Office 3,496,027
Patented Feb. 17, 1970

3,496,027

THERMOELECTRIC GENERATOR COMPRISING THERMOELEMENTS OF INDIUM-GALLIUM ARSENIDES OR SILICON-GERMANIUM ALLOYS AND A HOT STRAP OF SILICON CONTAINING SILICIDES

Andrew G. F. Dingwall, Cedar Grove, and Robert K. Pearce, Basking Ridge, N.J., assignors to RCA Corporation, a corporation of Delaware Filed May 3, 1965, Ser. No. 452,739
Int. Cl. H01v *1/30*
U.S. Cl. 136—205 6 Claims This invention relates generally to the art of thermoelectric devices, and particularly to an improved thermoelectric device of the type adapted to generate electrical power by the application of heat to a strap connecting one end of each of two thermoelements of semiconductor materials of opposite conductivity types. The ends remote from the aforementioned ends of the two thermoelements are maintained at a colder temperature. Such a thermoelectric device is said to operate in accordance with the Seebeck effect.

Thermoelectric devices employing, for example, silicon-germanium alloy thermoelements and having doped silicon straps bonded to the thermoelements at their hot ends can be operated efficiently at temperatures up to about 1000–1100° C. for long periods of time. The average coefficient of thermal expansion of silicon over the range 0–1000° C. is about $4.2\times10^{-6}$ inch/inch/° C., and the average coefficient of thermal expansion of the silicon-germanium thermoelements is between about $4.6\times10^{-6}$ and $4.9\times10^{-6}$ inch/inch/° C., depending upon the composition of the silicon-germanium alloy. It is found that under certain severe operating conditions involving, for example, high temperature on-off cycling of the thermoelectric devices, the difference between the coefficients of thermal expansion of the silicon strap and the silicon-germanium alloy thermoelements may produce a stress on the strap sufficient to cause cracking of the strap and failure of the thermoelectric device.

It is an object of this invention to provide an improved thermoelectric device hot strap material.

A further object of this invention is to provide an improved thermoelectric device having a silicon material hot strap, the hot strap having a coefficient of thermal expansion sufficiently matched to that of the thermoelements to prevent cracking of the hot strap, and said strap having high strength and low electrical resistivity.

For achieving these objects, the thermoelectric hot strap is made from a P or N doped silicon alloy including a silicide phase dispersed evenly throughout a silicon matrix. The silicide phase consists of one or more silicides of materials from group VI*a* of the Periodic Table, that is, chromium, molybdenum, and tungsten; from group V*a* of the Periodic Table, that is, vanadium, niobium, and tantalum; and from group IV*a*, that is, titanium, zirconium, and hafnium.

Figure 1:
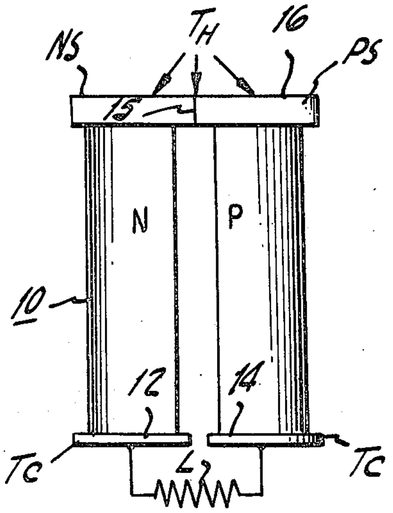
FIG. 1 is a front elevational view of a thermoelectric device.

The thermoelectric device or generator 10 shown in FIG. 1 comprises N type and P type semiconductor thermoelements N and P, respectively, each of the elements comprising, for example, a silicon-germanium alloy. These elements may be either poly-crystalline or single crystalline. The thermoelement P is heavily doped with an electron accepter element such as boron, aluminum, or gallium from group III*b* of the chemical Periodic Table, and the thermoelement N is heavily doped with an electron donor element such as phosphorous or arsenic from group V*b* of the chemical Periodic Table.

A shoe NS of N type silicon alloy (described hereinafter) is joined to what is to become the hot end of the thermoelement N. A shoe PS of P type silicon alloy (described hereinafter) is joined to the hot end of the thermoelement P. The shoes NS and PS may be rectangular blocks substantially the same size and having abutting faces 15 each with an area at least as great as the cross-sectional area of each thermoelement taken perpendicularly to the longitudinal axis thereof. (The thermoelements N and P may have semi-circular cross-sections, as the thermoelements N and P in the device shown in FIG. 2.) The abutting faces 15 of the shoes NS and PS are bonded to one another. The exposed surfaces of the shoes NS and PS are of sufficient size to receive an adequate quantity of heat from a heat source, not shown, for the efficient operation of the thermoelectric generator 10.

The silicon alloy shoes NS and PS may be bonded to each other and to the thermoelements N and P by means of hot pressed diffusion bonds. The bonds are non-rectifying and of low electrical resistance. The bond between the shoes NS and PS may be obtained by first applying a layer of material such as chromium, cobalt, iron, managanese, nickel, niobium, rhenium, rhodium, tantalum, titanium, zirconium, tungsten, or molybdenum between the shoes NS and PS. A diffusion bond is formed by heating the shoes while the shoes are pressed together. The temperature to which the shoes are heated should be at least about 85% of the melting point, but below the melting point, of any of the shoe materials or eutectics that may be formed between the contracting materials. For example, where the intermediate metallic layer is of chromium or titanium, the temperature at which the bonding process is carried out is between 1050° C. and 1200° C., and the pressure may be between about 200 and 500 p.s.i. This operation is preferably carried out in a vacuum or in a neutral ambient, such as argon, for example. The aforementioned heat and pressure may be applied for a period ranging from one half minute to one hour until a solid diffusion between the metal intermediate layer and the abutting shoes has taken place.

The bond between each shoe NS and PS and its respective thermoelement N or P may be obtained in the same manner but without the use of an intermediate metal layer and with pressures in the order of 5–10 p.s.i.

A pair of metal shoes 12 and 14, preferably of tungsten, are fixed to what is to become the cold ends of the thermoelements N and P, by any suitable known bonding techniques such as brazing the tungsten shoes to the cold ends of the thermoelements with copper or a noble metal or an alloy of noble metals. Alternately, the tungsten shoes may be diffusion bonded to the thermoelements by the application of heat and pressure in the same manner and at the same time the shoes NS and PS are bonded to the thermoelements N and P.

After the shoes NS and NP are brazed to each other and to the thermoelements N and P, the shoes comprise a hot strap 16.

Figure 2:
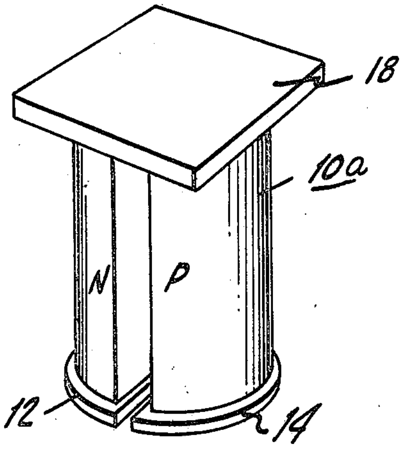
FIG. 2 is a perspective view of another thermoelectric device.

Referring now to FIG. 2, a thermoelectric device 10*a* is shown which comprises an N type thermoelement N, a P type thermoelement P, and a connecting hot strap 18 composed entirely of either N type silicon alloy or P type silicon alloy. The thermoelements N and P have tungsten shoes 12 and 14, respectively, bonded at the opposite or cold end of the elements.

In the operation of the thermoelectric generators 10 and 10*a*, heat is applied to the hot straps 16, 18 by any suitable means. The temperature $T_h$ of the applied heat can be almost as high as the melting point of the materials in the hot end of the generator. The tungsten shoes 12 and 14 are placed in contact with a cold sink (not shown) to maintain them at a relatively lower temperature $T_c$, as compared with the higher temperature $T_h$. Under these conditions, a voltage is generated between the shoes 12 and 14 and current is caused to flow through a load L, represented herein as a resistor connected between the shoes 12 and 14. For maximum efficiency of the generators, the electrical resistivity of the straps 16, 18 should be as low as possible.

Straps 16, 18 are made from an alloy comprising a precipitated phase of one or more silicides uniformly dispersed in a matrix of silicon. The silicides are of materials from groups VI*a*, V*a*, and IV*a* of the Periodic Table, that is, chromium, molybdenum, tungsten, vanadium, niobium, tantalum, titanium, zirconium, and hafnium. The proportion of silicides to silicon varies depending upon the desired coefficient of thermal expansion of the alloy. The higher the percentage of silicide, the higher is the coefficient of thermal expansion. The percentage of silicide used may vary between about 1 and 8 molar percent. Percentages below 1% cause little increase in the coefficient of thermal expansion of the silicon material. Percentages above 8% generally cause a lowering of the strength of the material.

For providing low electrical resistivity, the straps 16, 18 are heavily doped. The use of doping agents for this purpose is known. The shoe NS may be heavily doped with an electron donor element such as phosphorous or arsenic from group V*b* of the Periodic Table, and the shoe PS may be heavily doped with an electron acceptor element such as boron, aluminum, or gallium from group III*b* of the Periodic Table. About 1 to 3 molar percent of dopant is generally used, depending upon the solubility of the dopant in silicon.

The following table lists the electrical resistivity of several hot strap materials designed for use with thermoelements made from a doped alloy comprising, by atomic weight, about 80% silicon and 20% germanium (and traces of dopants), having a coefficient of thermal expansion of about $4.6\times10^{-6}$ inch/inch/° C. Each hot strap material has a coefficient of thermal expansion of around $4.6\times10^{-6}$ inch/inch/° C., and has a thermal conductivity of around 0.4 watt/cm.-° C. (at 25° C.) or about 0.25 watt/cm.-° C. at 800° C.

| Mole composition: | Resistivity $\times10^{-3}$ ohm-cm. (at 20° C.) |
|---|---|
| 0.93Si, 0.03B, 0.04Nb | 0.60 |
| 0.93Si, 0.03B, 0.04V | 0.90 |
| 0.93Si, 0.03B, 0.04Ta | 0.70 |
| 0.92Si, 0.03B, 0.05Mo | 0.28 |
| 0.92Si, 0.03P, 0.05Mo | 0.28 |
| 0.91Si, 0.03B, 0.05Mo, 0.01Nb | 0.33 |
| 0.91Si, 0.03B, 0.05Mo, 0.01W | 0.28 |
| 0.92Si, 0.03P, 0.05Nb | 0.60 |

Each of the listed compositions has such physical characteristics as to warrant its use as a hot strap material. That is, each composition does not react with the silicon-germanium thermoelement materials at operating temperatures, and, in comparison with typical silicon-germanium thermoelectric alloys, has a low electrical resistivity and a high thermal conductivity. Each composition is chemically stable at high temperatures. That is, each composition has no highly volatile ingredients which are driven off at high temperatures and none of the compositions deteriorates in air. Further, each composition has a coefficient of thermal expansion closely matched to the coefficient of thermal expansion of the thermoelement with which it is used.

For maximum efficiency of a thermoelectric device, the electrical resistivity of the hot strap should be as small as possible. For this reason, compositions containing molybdenum (in the form of molybdenum disilicide in the alloy) are preferred. Compositions containing tungsten also provide low electrical resistivity. However, the casting or pouring temperature of a silicon-tungsten alloy containing the desired proportion of tungsten is at such a high temperature (between 1700–1800° C. for 6% tungsten) that casting of the alloy requires special and expensive apparatus.

It is found that the 5% molybdenum-silicon alloy hot straps have such great strength that they may be used with silicon and germanium alloys varying in composition, by atomic weight, from 63.5% silicon-35.5% germanium (having a coefficient of thermal expansion of about 4.9 inch/inch/° C.) to 85% silicon-15% germanium (having a coefficient of thermal expansion of about $4.5\times10^{-6}$ inch/inch/° C.).

The hot strap materials are prepared by melting the various ingredients of a given composition in a casting furnace in an argon atmosphere and casting the melt into a preheated mold. The details of the melt preparation vary depending upon the particular composition being made.

P and N doped silicon-molybdenum disilicide hot shoe materials are made as follows: A casting furnace is used containing a mold composed of a quartz or other high temperature tube which is non-reactive with silicon and which is mounted in a well insulated container capable of being heated to a temperature exceeding 1400° C. The inner wall of the mold is coated with carbon to reduce silicon attack. Means are provided for heating the mold. The casting furnace also contains a crucible and separate means for heating the crucible to temperatures exceeding 1650° C. The crucible is tiltable for casting its contents into the mold.

The proper amounts of silicon, molybdenum, and either boron or phosphorous, depending upon whether a P or N doped composition is being made, are weighed out. In the case of the P doped composition containing boron, all the constituents are placed in the crucible. In the case of N doped material, the phosphorous, which has a high vapor pressure at elevated temperatures, is placed in a tray disposed above the crucible where it may be maintained at a cool temperature while the silicon and molybdenum in the crucible are heated.

The casting furnace is pumped down to a pressure below one micron of mercury and heat is then applied to the crucible to raise the temperature of the charge therein to a temperature of around 1600° C. to melt the charge to a liquid form. A partial atmosphere of argon is added to the system before the melting temperature of the charge is reached, the argon serving to suppress sublimation or boiling off of the heated charge.

The molten charge in the crucible is heated for several minutes at a temperature of 1600° C. and, in the case of the phosphorous doped composition, the phosphorous is poured into the charge after this period. After a further minute of heating for dissolving the phosphorous, the molten charge is poured into the mold which, prior to this, has been heated to a temperature of around 1200° C. The mold heating means is turned off and the charge in the mold is allowed to cool at a rate of about 10° C./min. When the temperature of the charge drops below 400° C., the casting furnace is opened and the casing is removed.

By proper selection of the amount of silicide forming material added to the silicon, silicon hot shoes may be prepared having a range of coefficients of expansion between 4.2 and $5.0\times10^{-6}$ inch/inch/° C. The silicon alloy hot shoes thus have utility with other thermoelectric materials such as doped 65% indium arsenide-35% gallium arsenide (by mol percent) alloys having a coefficient of thermal expansion in the order of $5.5\times10^{-6}$ inch/inch/° C.

What is claimed is:

1. A thermoelectric generator comprising N and P type semiconductor thermoelements comprising a material selected from the group consisting of alloys of indium arsenide-gallium arsenide, and silicon-germanium, a hot strap bonded to said thermoelements, said hot strap consisting essentially of a major proportion of silicon, and a minor proportion comprising a dopant for said silicon, and at least one dispersed material selected from the group consisting of silicides of chromium, molybdenum, tungsten, vanadium, niobium, tantalum, titanium, zirconium, and hafnium.

2. A thermoelectric generator comprising:
N type and P type semiconductor thermoelements,
said thermoelements comprising a material selected from the group consisting of alloys of indium arsenide-gallium arsenide, and silicon-germanium,
a hot strap comprising a P type semiconductor shoe and an N type semiconductor shoe, said shoes being bonded to each other, said P type thermoelement being bonded to said P type shoe, and said N type thermoelement being bonded to said N type shoe, and
said shoes consisting essentially of a major proportion of silicon, and a minor proportion comprising at least one doping material for said silicon, and between 1 and 8 molar percent of one or more dispersed materials selected from the group consisting of silicides of chromium, molybdenum, tungsten, vanadium, niobium, tantalum, titanium, zirconium, and hafnium.

3. A thermoelectric generator as in claim 2 wherein said dispersed material is a silicide of molybdenum.

4. A thermoelectric generator comprising N and P type semiconductor thermoelements comprising an alloy, by mole composition, of 65% indium arsenide-35% gallium arsenide, a hot strap bonded to said thermoelements, said hot strap consisting essentially of a major proportion of silicon, and a minor proportion comprising a dopant for said silicon, and at least one dispersed material selected from the group consisting of silicides of chromium, molybdenum, tungsten, vanadium, niobium, tantalum, titanium, zirconium, and hafnium.

5. A thermoelectric generator as in claim 4 wherein said dispersed material is between 1 and 8 molar percent.

6. A thermoelectric generator comprising N type and P type silicon-germanium thermoelements having a composition varying between, by atomic weight, from 63.5% silicon-36.5% germanium to 85% silicon-15% germanium, a hot strap bonded to said thermoelements, said hot strap comprising, by mole composition, 92% silicon, 3% dopant, and 5% molybdenum disilicide.

References Cited

UNITED STATES PATENTS

| | | | |
|---|---|---|---|
| 2,597,752 | 5/1952 | Salisbury | 136—208 |
| 2,811,568 | 10/1957 | Lloyd | 136—202 |
| 3,061,656 | 10/1962 | Chappell | 136—236 X |
| 3,256,699 | 6/1966 | Henderson | 136—239 X |
| 3,276,915 | 10/1966 | Horsting et al. | 136—205 |
| 3,285,017 | 11/1966 | Henderson et al. | 136—239 X |
| 3,338,753 | 8/1967 | Horsting | 136—237 |
| 3,342,646 | 9/1967 | Dingwall et al. | 136—205 |

FOREIGN PATENTS

| | | |
|---|---|---|
| 900,888 | 7/1962 | Great Britain. |
| 633,828 | 7/1936 | Germany. |

ALLEN B. CURTIS, Primary Examiner

U.S. Cl. X.R.

136—239; 252—62.3